United States Patent [19]

Farwell

[11] Patent Number: 5,198,760
[45] Date of Patent: Mar. 30, 1993

[54] METHOD BY WHICH TO DETECT DIRECTION OF CURRENT FLOW IN OUTPUTS OF INTEGRATED CIRCUITS

[75] Inventor: William D. Farwell, Thousand Oaks, Calif.

[73] Assignee: Hughes Aircraft Company, Los Angeles, Calif.

[21] Appl. No.: 767,596

[22] Filed: Sep. 30, 1991

[51] Int. Cl.$^5$ .................. G01R 31/28; G08B 3/00
[52] U.S. Cl. .................. 324/158 R; 324/73.1; 371/15.1; 340/664
[58] Field of Search ............ 324/158 R, 158 F, 73.1, 324/433; 371/22.4, 22.6, 15.1, 25.1; 340/660, 661, 662, 664

[56] References Cited

U.S. PATENT DOCUMENTS

| | | | |
|---|---|---|---|
| 4,366,393 | 12/1982 | Kasuya | 324/158 R |
| 4,720,671 | 1/1988 | Tada et al. | 324/158 R |
| 4,782,283 | 11/1988 | Zasio | 324/158 R |
| 4,961,053 | 10/1990 | Krug | 324/158 R |
| 5,059,899 | 10/1991 | Farrworth et al. | 324/158 R |

*Primary Examiner*—Vinh Nguyen
*Attorney, Agent, or Firm*—L. A. Alkov; W. K. Denson-Low

[57] ABSTRACT

Test circuitry implemented in an integrated circuit having a plurality of outputs for testing the current at the outputs of output drivers of the integrated circuit without physical removal of the integrated circuit from an assembly in which it is incorporated. The test circuit includes a first test bus, a second test bus, and comparator circuitry responsive to the signals on the first and second test busses. Associated with each of the output drivers are (a) a current sensing resistor for sensing the current flow at the output of the buffer, (b) a first transmission gate connected between one side of the sensing resistor and the first test bus, and (c) a second transmission gate connected between the other side of the sensing resistor and the second test bus. The first and second transmission gates associated with an output buffer are controlled in parallel via a scan register. As to a selected output driver whose associated transmission gates are turned on, the comparison circuitry provides an indication as to whether the current flow sensed by a selected current sensing resistor is outside a predetermined range.

5 Claims, 1 Drawing Sheet

METHOD BY WHICH TO DETECT DIRECTION OF CURRENT FLOW IN OUTPUTS OF INTEGRATED CIRCUITS

BACKGROUND OF THE INVENTION

The subject invention is directed generally to test circuitry for integrated circuits, and more particularly to built-in test circuitry that provides for in-system isolation of a stuck driver on a multi-driver bus.

By use of known fault detection techniques including boundary scan, integrated circuit output faults are detected, and many possible faults can be isolated by analyzing the logical states of nodes at particular times with the knowledge of what logical levels are expected. However, isolation of a faulty output driver responsible for a multi-driver stuck-at fault, wherein the logical level of a node is stuck-at a particular logical level, is presently accomplished pursuant to one-by-one removal of each driver from a node and checking to see if the node becomes unstuck.

SUMMARY OF THE INVENTION

It would therefore be an advantage to provide a test circuit that allows for identification of a faulty driver in a multi-driver stuck-at fault without the one-by-one physical removal of drivers.

The foregoing and other advantages are provided by the invention in a test circuit that can be incorporated in an integrated circuit having a plurality of output drivers for providing output signals on associated signal pads. The test circuit includes a first test bus, a second test bus, and comparator circuitry responsive to the signals on the first and second test busses. Associated with each of the output drivers are (a) a current sensing resistor for sensing the current flow at the output of the buffer, (b) a first transmission gate connected between one side of the sensing resistor and the first test bus, and (c) a second transmission gate connected between the other side of the sensing resistor and the second test bus. The first and second transmission gates associated with an output buffer are controlled in parallel via a scan register. As to a selected output driver whose associated transmission gates are turned on, the comparison circuitry provides an indication as to whether the current flow sensed by a selected current sensing resistor is outside a predetermined range.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
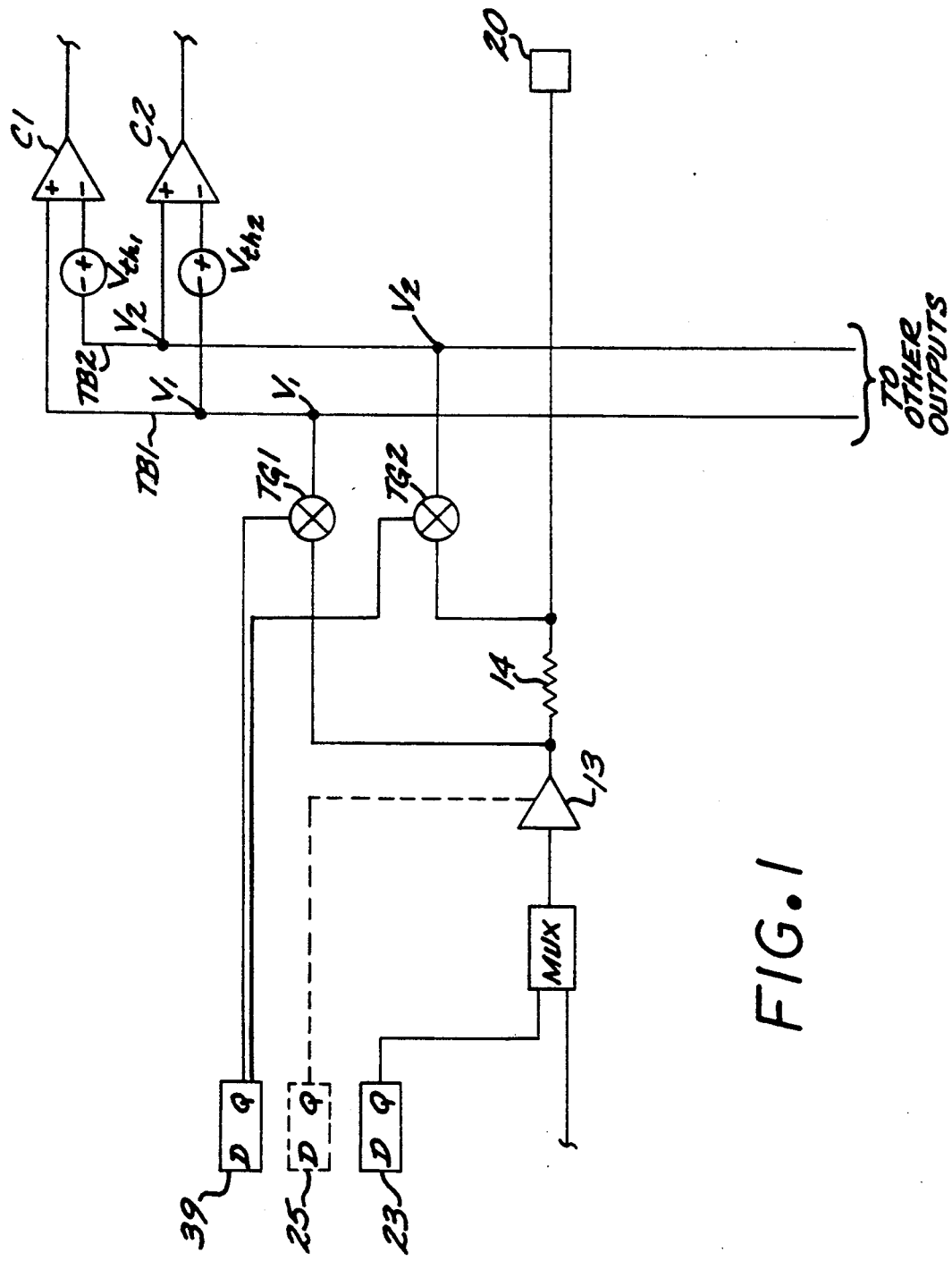
FIG. 1 is a schematic diagram of a test circuit in accordance with the invention.

In the following detailed description and in the several figures of the drawing, like elements are identified with like reference numerals.

The disclosed invention is directed to test circuitry that can be incorporated into a circuit device such as an integrated circuit to allow testing of the current at the outputs of output drivers of the circuit device without physical removal of the circuit device from an assembly in which it is incorporated. In accordance with the invention, respective driver current sensing circuits are provided for output functions of the circuit device, and such current sensing circuits are commonly connected to comparator circuitry via test busses.

FIG. 1 schematically depicts test circuitry in accordance with the invention as utilized with an output function that includes an output driver 13 whose input is provided by a 2-to-1 multiplexer 21. The inputs to the multiplexer 21 are provided by the interior logic of the integrated circuit and the Q output of an output drive control scan flip-flop 23. The output driver 13 can be a three-state driver, as indicated by the dashed control line connected thereto, and in which case the control input to the output driver would be provided by the Q output of a buffer control scan flip-flop 25, for example.

In accordance with the invention, a current sense resistor 14 is connected between the output of the output driver 13 and an associated output pad 20. The terminal of the current sense resistor 14 connected to driver output is coupled to a first test bus TB1 via a first transmission gate TG1. The terminal of the current sense resistor 14 connected to the associated I/O pad is coupled to a second test bus TB2 via a second transmission gate TG2. The transmission gates TG1, TG2 are controlled in parallel by the Q output of a transmission gate control scan flip-flop 39 in a double-pole-single-throw configuration, whereby both transmission gates TG1, TG2 are on or off together.

The first test bus TB1 is connected to the non-inverting input of a first comparator C1 and to the inverting input of a second comparator C2. The second test bus TB2 is connected to the inverting input of the first comparator C1 and to the non-inverting input of the second comparator C2.

The current sense resistors for other output functions are similarly coupled to the test busses TG1, TG2 via respective first and second transmission gates that controlled in double-pole single-throw configuration by respective transmission gate control scan flip-flops. In this manner, a single pair of test busses TG1, TG2 and a single pair of comparators C1, C2 are utilized to sense the output current of a selected one of a plurality of output functions.

As schematically depicted in FIG. 1, the first comparator C1 has a predetermined offset voltage $V_{th1}$ by which the voltage V1 on the first test bus TB1 must exceed the voltage V2 on the second test bus TB2 in order for the output of the first comparator C1 to be high. That is, the output of the first comparator C1 will be high only when the following is true:

$$V1 > (V2 + V_{th1}) \quad \text{(Equation 1)}$$

Similarly, the second comparator C2 has a predetermined offset voltage $V_{th2}$ by which the voltage on the second test bus TB2 must exceed the voltage V1 on the first test bus TB1 in order for the output of the second comparator to be high. That is, the output of the first comparator C1 will be high only when the following condition is true:

$$V2 > (V1 + V_{th2}) \text{ or } V1 < (V2 - V_{th2}) \quad \text{(Equation 2)}$$

While the offset voltages for the comparators C1, C2 have schematically depicted outside the comparators for ease of understanding, it should be appreciated such offset voltages can be internal to the comparators C1, C2.

As discussed more fully herein, the test circuitry of the invention functions to connect the sense resistor of a selected output driver to the test busses TB1, TB2 so that determinations can be made as to whether the output driver current $I_{out}$ is within a specified acceptable range.

When the output driver is set to 1, it will source a positive current into loads (i.e., current flow is out of the driver). The magnitude of the maximum acceptable source current ($I_{source}$) is defined by the value $R_s$ of the sensing resistor 14 and the threshold voltage $V_{th1}$ of the first comparator:

$$I_{source} = (V_{th1})/R_s \quad \text{(Equation 3)}$$

This threshold follows from setting $V1 = V2 + V_{th1}$ which is the lowest value for V1 that meets the inequality of Equation 1.

When the output driver is set to 0, it will sink current from loads (i.e., current flow is into the driver). The magnitude of the maximum acceptable sink current ($I_{sink}$) is defined by the value $R_s$ of the sensing resistor 14 and the threshold voltage $V_{th2}$ of the second comparator:

$$I_{sink} = (V_{th2})/R_s \quad \text{(Equation 4)}$$

This threshold follows from setting $V2 = V1 + V_{th2}$ which is the lowest value for V2 that meets the inequality of Equation 2.

Effectively, the first comparator C1 detects if the magnitude of sourcing current of the output driver exceeds a sourcing current limit; and the second comparator detects if the magnitude of sinking current of the output driver exceeds a sinking current limit.

The particular current thresholds or limits are selected depending upon the logic family be utilized and the expected driver output characteristics in the respective 0 and 1 states. Once the particular current thresholds are selected, the values of the first threshold voltage $V_{th1}$, the second threshold voltage $V_{th2}$, and the sense resistor value $R_s$ are selected. The thresholds voltages $V_{th1}$, $V_{th2}$ may be different or the same, depending on the relative current sourcing and sinking capability of the output drivers of the integrated circuit in which the invention is implemented. The ratio of $I_{source}/I_{sink}$ is typically constant for all output drivers of an integrated circuit, even though their absolute drive capabilities may differ. The value of the current sensing resistance R will be specified differently for different output drivers, depending absolute drive capability of the driver. For example, a buffer with twice the current drive of another would have a sensing resistor that has one-half the resistance of the sensing resistor for such other driver.

The values of R, $V_{th1}$, $V_{th2}$ must be designed with some tolerances for production and operational variability. Values are selected such that, for worst cases of variability due to tolerance build-up, the current magnitude limits $I_{source}$ and $I_{sink}$ are within an acceptable range. Specifically, the magnitude of the sinking current limit of is less than the maximum specified load current, and the magnitude of the sourcing current limit is less than the minimum specified driver short circuit current. For CMOS, typical respective acceptable ranges for magnitudes of sourcing current and sinking current limits would be:

0.1 ma $< I_{source} <$ 10 ma 0.1 ma $< I_{sink} <$ 20 ma

For ease of understanding, the foregoing has discussed sourcing and sinking current limits in terms of magnitudes, with current direction being implicit. More generally however, it should be appreciated that effectively the sense resistance and the thresholds of the comparators are configured to detect if current of the output driver is outside a predetermined range, where such range is between a positive current limit (sourcing current) and a negative current limit (sinking current). Thus, the driver current $I_{out}$ is determined to be acceptable if it is within a range as follows:

$$I_{th1} > I_{out} > I_{th2}$$

wherein $I_{th1}$ is a positive current and $I_{th2}$ is a negative current.

In accordance with conventional boundary scan techniques, the output drive control scan flip-flops 23 for the plurality of outputs, any three-state buffer control scan flip-flops 25, and the transmission gate control scan flip-flops may be connected in a single chain, or in multiple parallel chains for the respective test functions of output drive control, output buffer control, and transmission gate control. In this manner, output drive control data, three-state buffer control, and transmission gate control data can be serially scanned in pursuant to conventional boundary scan techniques.

The output buffers 13 are conventionally utilized in integrated circuits, and boundary scan circuitry including the scan registers 23 are commonly utilized in integrated circuits. Thus, test circuit circuitry in accordance with the invention generally calls for addition to each output of the current sensing resistor 14; the two transmission gates TG1, TG2; and the transmission gate control scan flip-flop 39. Further, the first and second test busses TB1, TB2 and the comparators C1, C2 are also added to the integrated circuit.

The test circuitry of the invention is utilized by performing the following procedure as to each of the drivers connected to a node determined to be stuck-at.

1. By scan control, turn on the transmission gates of the driver under test and turn off the transmission gates of all other drivers.
2. By scan control, set the driver under test to drive a 1.
3. Record test result which would be one of the following: (a) no current sensed, (b) sourcing current, or (c) sinking current.
4. Repeat the foregoing for driver states of 0 and high impedance.

Conclusions that can be determined from the test results are set forth in the following table wherein DUT refers to "device under test" and High Z denotes the high impedance state:

| Driver State | Unacceptable Current Detected | Conclusion |
|---|---|---|
| 1 | None | No current fault |
| 1 | Sourcing current | Fault exists elsewhere |
| 1 | Sinking current | Fault at DUT |
| 0 | None | No current fault |
| 0 | Sourcing current | Fault at DUT |
| 0 | Sinking current | Fault exists elsewhere |
| High Z | None | No current fault |
| High Z | Sourcing current | Fault at DUT |

| Driver State | Unacceptable Current Detected | Conclusion |
| --- | --- | --- |
| High Z | Sinking current | Fault at DUT |

In the foregoing test, if the conclusion for each driver connected to a stuck-at node is "fault exists elsewhere", then there is an interconnect short. Sourcing current implies a short to a low voltage, while sinking current implies a short to a high voltage.

Pursuant to the foregoing, the cause of a stuck-at multi-driver node can be isolated to a single bad driver, or to a faulty interconnection between drivers.

While the foregoing has been described in the context of dedicated output functions for ease of understanding, it should be appreciated that test circuitry in accordance with the invention can be implemented with the output drivers of bidirectional input/output functions, such as those disclosed in commonly assigned U.S. application Ser. No. 07/725,866, filed Jul. 3, 1991, for AN IMPROVED METHOD OF TESTING INTERCONNECTIONS IN DIGITAL SYSTEMS BY THE USE OF BIDIRECTIONAL DRIVERS, incorporated herein by reference.

The foregoing has been a disclosure of test circuitry that can be incorporated into integrated circuits to enable isolation and current testing of output drivers without removal of the devices containing the drivers from the system in which they are utilized.

Although the foregoing has been a description and illustration of specific embodiments of the invention, various modifications and changes thereto can be made by persons skilled in the art without departing from the scope and spirit of the invention as defined by the following claims.

What is claimed is:

1. A test circuit for an integrated circuit having output buffer for providing output signal on associated signal pad, comprising:
   a first test bus;
   a second test bus;
   current sensing means connected to said output buffers;
   selection means respectively associated with respective current sensing means for controllably coupling said current sensing means to said first and second test busses; and
   comparator means responsive to the signals on said first and second test busses for providing an indication of whether the current flow sensed by a selected current sensing means is outside a predetermined range.

2. The test circuit of claim 1 wherein:
   said current sensing means includes a current sensing resistor;
   said selection means includes (a) a first transmission gate connected between one side of said current sensing resistor and said first test bus, and (b) a second transmission gate connected between the other side of the associated current sensing resistor and said second test bus; and
   said comparator means includes first and second comparators having inputs connected to said first test bus and said second test bus.

3. The test circuit of claim 2 wherein the first and second transmission gates said an output buffer are controlled in parallel via a scan register.

4. A test circuit for an integrated circuit having an output buffer for providing output signal on an associated signal pad, comprising:
   a first test bus;
   a second test bus;
   current sensing means connected to said output buffer;
   selection means respectively associated with respective current sensing means for controllably coupling a selected current sensing means to said first and second test busses; and
   comparator means responsive to the signals on said first and second test busses for providing an indication of whether current in a first direction sensed by said current sensing means is greater than a first direction current limit, and whether current in a second direction sensed by said current sensing means is greater than a second direction current limit.

5. A test circuit for an integrated circuit having output buffer for providing output signal on associated signal pads, comprising:
   current sensing means connected to said output buffer;
   comparator means selectively connectable to said current sensing means for providing an indication of whether current sensed by said current sensing means is outside a predetermined range; and
   selection means connected to said current sensing means for controllably connecting a selected current sensing means to said comparison means.

* * * * *